(12) United States Patent
Min et al.

(10) Patent No.: US 11,817,594 B2
(45) Date of Patent: Nov. 14, 2023

(54) BATTERY MODULE INCLUDING PROTECTION COVER COVERING FLEXIBLE PRINTED CIRCUIT BOARD

(71) Applicant: LG CHEM, LTD., Seoul (KR)

(72) Inventors: Dai Ki Min, Daejeon (KR); Jae Hyeon Ju, Daejeon (KR); Jisu Yoon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 558 days.

(21) Appl. No.: 17/043,420

(22) PCT Filed: Feb. 20, 2020

(86) PCT No.: PCT/KR2020/002471
§ 371 (c)(1),
(2) Date: Sep. 29, 2020

(87) PCT Pub. No.: WO2020/171627
PCT Pub. Date: Aug. 27, 2020

(65) Prior Publication Data
US 2021/0098846 A1    Apr. 1, 2021

(30) Foreign Application Priority Data
Feb. 21, 2019   (KR) ........................ 10-2019-0020706

(51) Int. Cl.
*H01M 50/24*  (2021.01)
*H01M 50/502* (2021.01)
(Continued)

(52) U.S. Cl.
CPC ....... *H01M 50/24* (2021.01); *H01M 10/4207* (2013.01); *H01M 50/204* (2021.01);
(Continued)

(58) Field of Classification Search
CPC ............ H01M 50/24; H01M 10/4207; H01M 50/204; H01M 50/271; H01M 50/287;
(Continued)

(56) References Cited

U.S. PATENT DOCUMENTS 5,278,002 A   1/1994  Hiers
9,024,572 B2  5/2015  Nishihara et al.
(Continued)

FOREIGN PATENT DOCUMENTS

CN  108305564 A   7/2018
CN  208240756 U  12/2018
(Continued)

OTHER PUBLICATIONS

Machine English translation of 2018/124751 (Year: 2018).*
(Continued)

*Primary Examiner* — Michael L Dignan
(74) *Attorney, Agent, or Firm* — Birch, Stewart, Kolasch & Birch, LLP

(57) ABSTRACT

A battery module includes a cell assembly including at least one battery cell, a module case accommodating the cell assembly, an upper frame positioned on one surface of the cell assembly in the module case to at least partially cover the cell assembly, a flexible printed circuit board configured to be mounted longitudinally on the upper frame to sense the battery cell, and a protective cover in which a main cover portion parallel to a main surface of the upper frame is mounted on the upper frame so as to cover the flexible printed circuit board in the module case.

10 Claims, 5 Drawing Sheets

(51) Int. Cl.
   *H01M 50/204* (2021.01)
   *H01M 50/271* (2021.01)
   *H01M 10/42* (2006.01)
   *H05K 5/03* (2006.01)
   *H01M 50/50* (2021.01)
   *H01M 50/287* (2021.01)
   *H01M 50/569* (2021.01)
   *H05K 1/11* (2006.01)

(52) U.S. Cl.
   CPC ....... *H01M 50/271* (2021.01); *H01M 50/287* (2021.01); *H01M 50/50* (2021.01); *H01M 50/502* (2021.01); *H01M 50/569* (2021.01); *H05K 5/03* (2013.01); *H01M 2220/20* (2013.01); *H05K 1/118* (2013.01)

(58) Field of Classification Search
   CPC .. H01M 50/50; H01M 50/502; H01M 50/569; H01M 2220/20; H01M 10/482; H01M 10/486; H01M 10/48; H01M 50/284; H01M 50/249; H01M 50/507; H01M 10/425; H01M 50/211; H01M 50/20; H01M 10/4257; H05K 5/03; H05K 1/118
   See application file for complete search history.

(56) References Cited

U.S. PATENT DOCUMENTS

| | | |
|---|---|---|
| 2009/0280401 A1 | 11/2009 | Kim |
| 2011/0293973 A1 | 12/2011 | Kim |
| 2013/0095359 A1* | 4/2013 | Yoshioka ............ H01M 50/209 429/99 |
| 2014/0234670 A1 | 8/2014 | Lee |
| 2014/0356687 A1 | 12/2014 | Heo et al. |
| 2018/0198300 A1 | 7/2018 | Jung et al. |
| 2019/0001838 A1 | 1/2019 | Choi et al. |
| 2019/0027731 A1 | 1/2019 | Zeng et al. |
| 2019/0081311 A1* | 3/2019 | Zeng .................... H01R 12/774 |
| 2019/0319232 A1 | 10/2019 | Ryu et al. |
| 2019/0348720 A1 | 11/2019 | Oh et al. |
| 2019/0389318 A1* | 12/2019 | Lee ...................... H01M 50/516 |
| 2020/0014005 A1 | 1/2020 | Lee et al. |
| 2020/0067293 A1* | 2/2020 | Oda ...................... H05K 5/0247 |
| 2021/0050566 A1* | 2/2021 | Wang .................. H01M 50/209 |

FOREIGN PATENT DOCUMENTS

| | | | |
|---|---|---|---|
| EP | 3474345 A1 | 4/2019 | |
| JP | 2004-171895 A | 6/2004 | |
| JP | 2009-272294 A | 11/2009 | |
| JP | 2011-249309 A | 12/2011 | |
| JP | 2014-157806 A | 8/2014 | |
| JP | 2019-23996 A | 2/2019 | |
| KR | 10-2012-0003432 A | 1/2012 | |
| KR | 10-2014-0072689 A | 6/2014 | |
| KR | 10-2016-0071900 A | 6/2016 | |
| KR | 10-2018-0038253 A | 4/2018 | |
| KR | 10-2018-0083025 A | 7/2018 | |
| KR | 10-2018-0099437 A | 9/2018 | |
| KR | 10-2018-0099438 A | 9/2018 | |
| KR | 10-2019-0027096 | * 3/2019 | ............ H01M 10/42 |
| WO | WO2018/124751 | * 7/2018 | ............. H01M 2/10 |
| WO | WO 2018/124751 A1 | 7/2018 | |
| WO | WO 2018/174451 A1 | 9/2018 | |

OTHER PUBLICATIONS

Extended European Search Report, dated May 3, 2021, for European Application No. 20759133.0.

International Search Report (PCT/ISA/210) issued in PCT/KR2020/002471, dated Jun. 8, 2020.

* cited by examiner

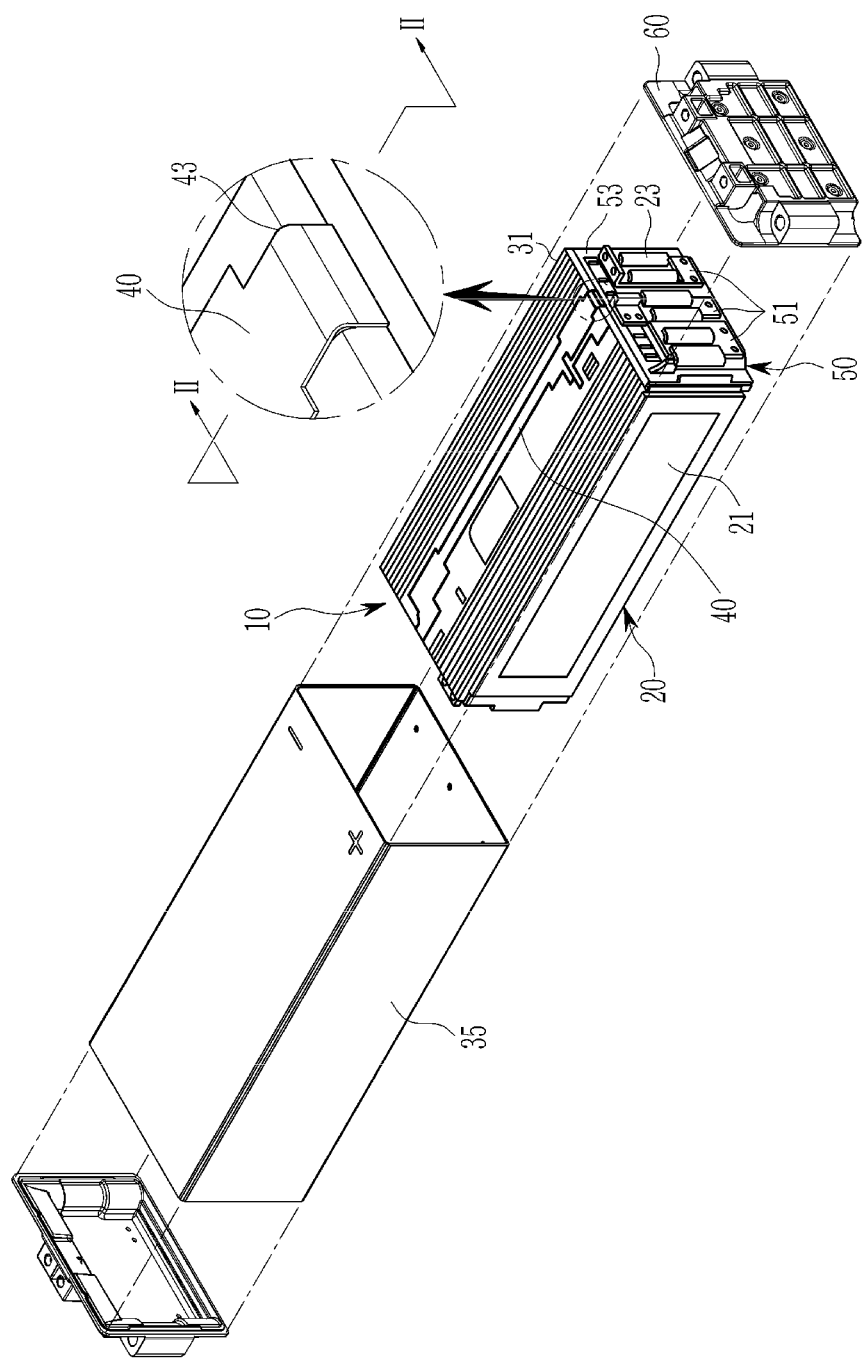
[FIG. 1]

[FIG. 2]
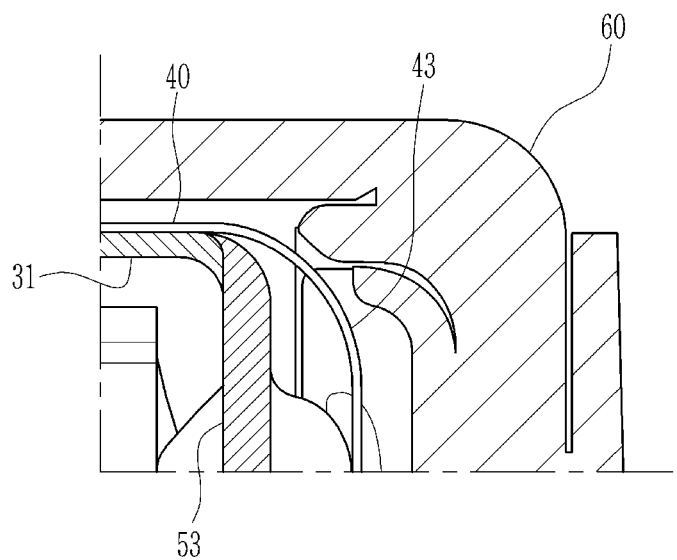

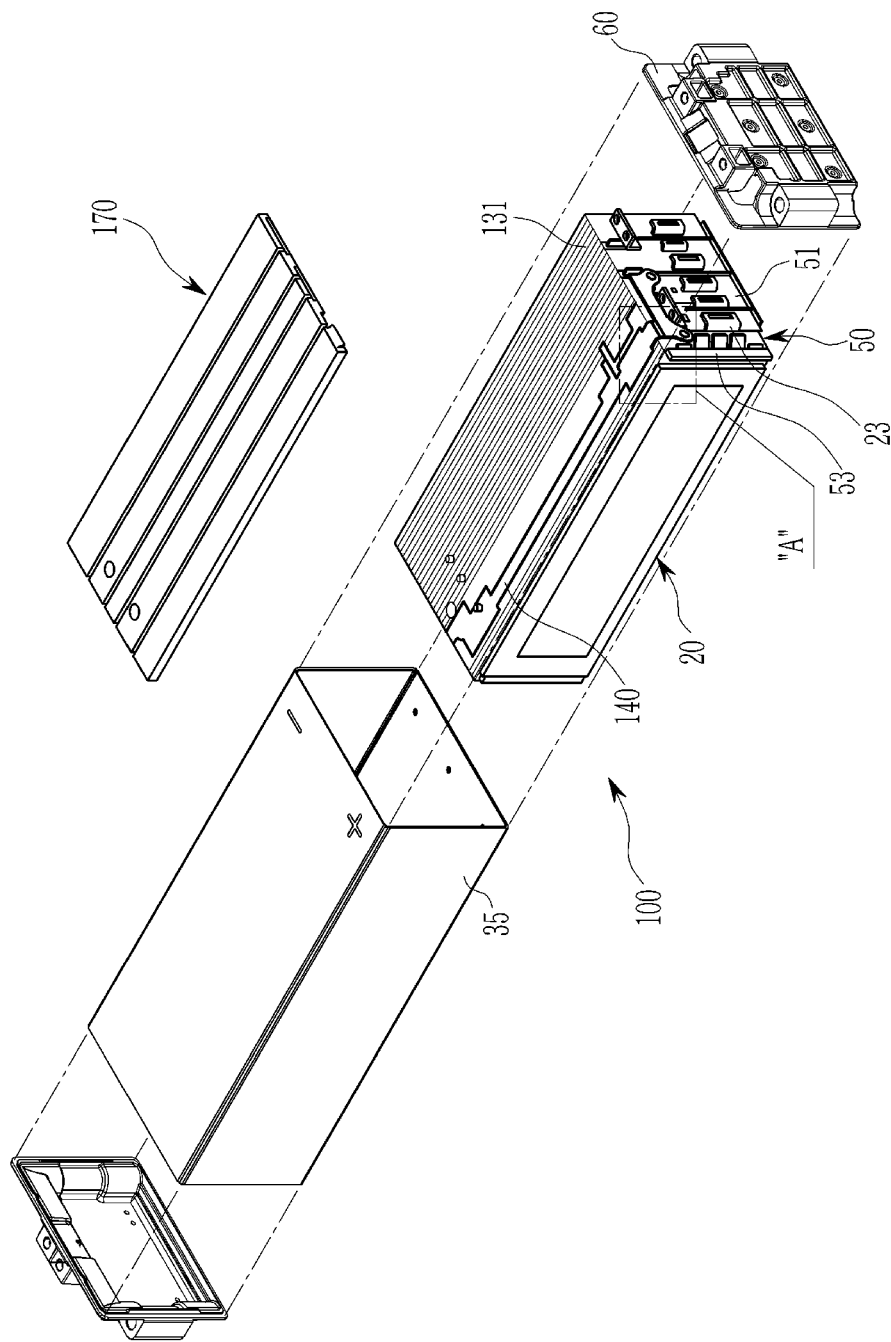
[FIG. 3]

[FIG. 4]
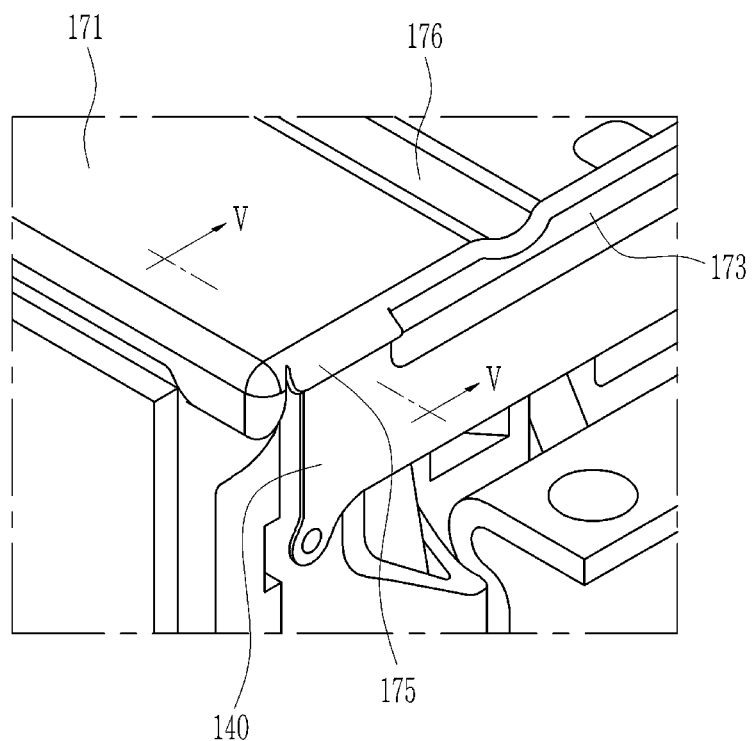

[FIG. 5]
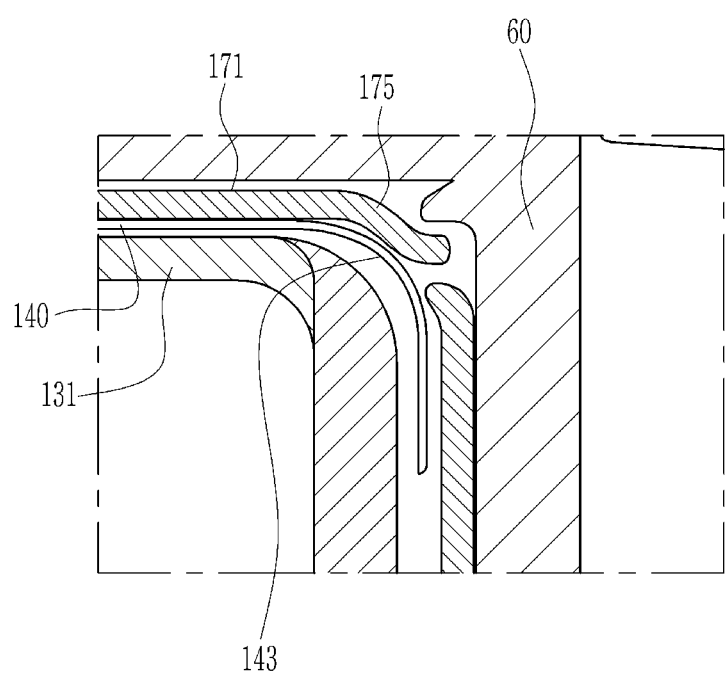

BATTERY MODULE INCLUDING PROTECTION COVER COVERING FLEXIBLE PRINTED CIRCUIT BOARD

CROSS CITATION WITH RELATED APPLICATION(S)

This application claims the benefit of priority based on Korean Patent Application No. 10-2019-0020706 filed with the Korean Intellectual Property Office on Feb. 21, 2019, the disclosure of which is incorporated herein by reference in its entirety.

The present disclosure relates to a battery module, and more particularly, to a battery module including a flexible printed circuit board sensing the battery module.

TECHNICAL FIELD

Background Art

Since secondary batteries are easily applied to various product groups and has electrical characteristics such as high energy density, they are universally applied not only for a portable device but also for an electric vehicle (EV) or a hybrid electric vehicle (HEV), an energy storage system or the like, which is driven by an electric driving source. The secondary battery is attracting attention as a new environment-friendly energy source for improving energy efficiency since it gives a primary advantage of remarkably reducing the use of fossil fuels and also does not generate by-products from the use of energy at all.

A battery pack for use in electric vehicles has a structure in which a plurality of cell assemblies, each including a plurality of unit cells, are connected in series to obtain a high output. In addition, the unit cell can be repeatedly charged and discharged by electrochemical reactions among components, which include a positive electrode current collector, a negative electrode current collector, a separator, an active material, an electrolyte and the like.

Meanwhile, as the need for a large capacity structure is increasing along with the utilization as an energy storage source in recent years, there is a growing demand for a battery pack with a multi-module structure in which a plurality of battery modules, each including a plurality of secondary batteries connected in series and/or in parallel, are integrated.

When a plurality of battery cells is connected in series or in parallel to configure a battery pack, it is common to configure a battery module composed of at least one battery cell first, and then configure a battery pack by using at least one battery module and adding other components. The number of battery cells included in the battery pack, or the number of battery cells included in the battery module may be variously set according to the required output voltage or the demanded charge/discharge capacity.

A flexible printed circuit board is configured such that it is connected to each of a plurality of battery cells to sense them, and may be mounted so that it extends to one side of the cell assembly to be connected to a busbar and a connector. In the mounting process, the flexible printed circuit board may be exposed to the outside, and thus, when damage is applied to the flexible printed circuit board, it may cause problems such as short circuit or disconnection of the circuit pattern.

DETAILED DESCRIPTION OF THE INVENTION

Technical Problem

It is an object of the present disclosure to provide a battery module capable of protecting a flexible printed circuit board from being damaged during an assembling process or an operating process by forming a cover covering the flexible printed circuit board.

However, the problem to be solved by the embodiments of the present disclosure is not limited to the above-described problems, and can be variously expanded within the scope of the technical idea included in the present disclosure.

Technical Solution

A battery module according to one embodiment of the present disclosure includes: a cell assembly including at least one battery cell, a module case accommodating the cell assembly, an upper frame positioned on one surface of the cell assembly in the module case to at least partially cover the cell assembly, a flexible printed circuit board configured to be mounted longitudinally on the upper frame to sense the battery cell, and a protective cover in which a main cover portion parallel to a main surface of the upper frame is mounted on the upper frame so as to cover the flexible printed circuit board in the module case.

The flexible printed circuit board includes a bent portion which is bent toward one side surface of the cell assembly at the end of the upper frame, and the protective cover may further include an eaves portion which is bent and extended to correspond to the bent portion of the flexible printed circuit board at the end of at least one side The protective cover may further include an edge portion bent to surround the edge of the cell assembly, and the eaves portion and the edge portion may extend at different angles with respect to the main surface of the main cover portion.

The angle at which the eaves portion is bent with respect to the main surface of the main cover portion may be formed smaller than the angle at which the edge portion is bent with respect to the main surface of the main cover portion.

The eaves portion may be formed by cutting a part of the edge portion.

The battery module further includes a busbar assembly comprising a busbar electrically connected to the electrode lead of the cell assembly, and a busbar frame covering the cell assembly on at least one side; and an end plate covering the busbar assembly on the outside, wherein the eaves portion of the protective cover may be positioned between the bent portion of the flexible printed circuit board and the end plate.

The protective cover may be made of a non-conductive injected material.

The protective cover may further include a reinforcing portion extending along the longitudinal direction of the cell assembly and formed into a recessed shape when viewed from the outside.

A plurality of the reinforcing portions may be formed, and the flexible printed circuit board may be positioned between adjacent reinforcing portions.

A battery pack according to another embodiment of the present disclosure may include the at least one battery module, and a pack case packaging the at least one battery module.

A device according to yet another embodiment of the present disclosure may include the at least one battery pack.

Advantageous Effects

According to the embodiments, since the battery module is configured such that the flexible printed circuit board positioned outside the upper frame covering the cell assembly is covered with the protective cover, it is effective in preventing damage to the flexible printed circuit board.

In addition, the flexible printed circuit board can be effectively protected by providing an eaves portion of the protective cover in a portion bent at one edge of the cell assembly.

BRIEF DESCRIPTION OF THE DRAWINGS

FIG. 1 is an exploded perspective view showing a battery module.

FIG. 2 is a cross-sectional view of the assembled battery module taken along line II-II in FIG. 1.

FIG. 3 is an exploded perspective view showing a battery module according to an embodiment of the present disclosure.

FIG. 4 is a partially enlarged perspective view showing part "A" in the combination of the battery modules of FIG. 3.

FIG. 5 is a cross-sectional view taken along line V-V in FIG. 4.

DETAILED DESCRIPTION OF THE EMBODIMENTS

Hereinafter, various embodiments of the present disclosure will be described in detail with reference to the accompanying drawings so that those skilled in the art can easily implement them. The present disclosure may be modified in various different ways, and is not limited to the embodiments set forth herein.

Further, throughout the specification, when a part is referred to as "including" a certain component, it means that it can further include other components, without excluding the other components, unless otherwise stated.

FIG. 1 is an exploded perspective view showing a battery module, and FIG. 2 is a cross-sectional view of the assembled battery module taken along line II-II in FIG. 1.

Referring to FIG. 1, a battery module 10 includes a cell assembly 20, and an upper frame 31 positioned on one surface thereof to at least partially cover the cell assembly 20. The cell assembly 20 is configured by stacking a plurality of battery cells 21, wherein each of the battery cell 21 may be provided as a pouch-type secondary battery. The plurality of battery cells 21 may be electrically connected to each other, and each of the battery cells 21 may include an electrode assembly, a battery case accommodating the electrode assembly, and an electrode lead 23 protruding out of the battery case and electrically connected to the electrode assembly.

The upper frame 31 is positioned to surround the upper surface of the cell assembly 20, and a busbar frame 53 is positioned on the side of the cell assembly 20 in the direction in which the electrode leads 23 are drawn out. A busbar 51 is fixed to the outside of the busbar frame 53 to form a busbar assembly 50, and the electrode leads 23 of the cell assembly 20 pass through a slit formed in the busbar frame 53 and are electrically connected to the busbar 51. The upper frame 31 and the busbar frame 53 may be made of an insulating material, for example, a non-conductive synthetic resin, and the busbar 51 may be made of a conductive metal material.

A flexible printed circuit board (FPCB) 40 is configured such that it is extended and mounted in the longitudinal direction of the upper frame 31 to sense the battery cell 21. That is, as shown in FIG. 1, the flexible printed circuit board 40 senses electrical and thermal data of each battery cell 21 while being seated on the upper surface of the upper frame 31. In addition, the flexible printed circuit board 40 is connected to the module connector and the busbar 51 while being bent toward the busbar frame 53 at the end of the upper frame 31. The modular connector may be coupled to the busbar assembly 50, particularly the busbar frame 53.

Meanwhile, a module case 35 is provided so as to accommodate the cell assembly 20 and the upper frame 31. The module case 35 forms the exterior of the battery module 10, and the busbar assembly 50 is coupled to one or both sides of the cell assembly 20 positioned in the direction where the electrode leads 23 are drawn out, and an endplate 60 is coupled to the outside thereof. Further, the flexible printed circuit board 40 is mounted on one surface of the upper frame 31 inside the module case 35.

In addition, the battery module 10 may include various electric components, and may include, for example, an internal circuit board (ICB), a battery management system (BMS) or the like. Electric components such as the ICB and the BMS board may be electrically connected to the plurality of battery cells.

Referring to FIG. 2, the flexible printed circuit board 40 forms a bent portion 43 while passing through an edge where the upper frame 31 and the busbar frame 53 meet. The flexible printed circuit board 40 thus bent is electrically connected to the module connector and the busbar 51.

The flexible printed circuit board 40 mounted on the upper frame 31 and bent toward the busbar frame 53 faces the inner surface of the module case 35 on the upper side, and faces the inner surface of the end plate 60 forward or backward. Therefore, when assembling the end plate 60 and the module case 35 after the flexible printed circuit board 40 is seated on the upper frame 31 in the manufacturing process, the flexible printed circuit board 40 exposed to the outside may be damaged. At this time, there is a possibility that the circuit pattern of the flexible printed circuit board 40 is disconnected, and if there is crosstalk between the circuit patterns, short circuits may occur and thus ignition may occur.

In addition, the bent portion 43 of the flexible printed circuit board 40 is not firmly fixed to the upper frame 31 or the busbar frame 53 and is partially floating in the space. As a result, when an external shock or vibration occurs, the bent portion 43 is rubbed against the inner surface of the module case 35 or the end plate 60, and, thus, the protective layer of the flexible printed circuit board 40 is peeled off, and the circuit pattern layer is exposed, which may cause problems such as short circuits.

FIG. 3 is an exploded perspective view showing a battery module according to an embodiment of the present disclosure, FIG. 4 is a partially enlarged perspective view showing a portion "A" in the combination of the battery modules of FIG. 3, and FIG. 5 is a cross-sectional view taken along line V-V in FIG. 4.

Referring to FIG. 3, a battery module 100 according to the present embodiment may mostly include the configuration of the battery module 10 illustrated in FIG. 1 as it is. That is, the battery module 100 includes a cell assembly 20 including a plurality of battery cells 21, and an upper frame 131 positioned on one surface of the cell assembly 20 to at least partially cover it. A busbar frame 53 is positioned on the side of the cell assembly 20 in the direction in which the electrode leads 23 are drawn out, and a busbar 51 is fixed to the outside of the busbar frame 53 to form a busbar assembly 50. The electrode leads 23 of the cell assembly 20 may be electrically connected to the busbars 51 via slits formed in the busbar frames 53.

A flexible printed circuit board 140 is configured such that it is extended and mounted in the longitudinal direction of the upper frame 131 to sense the battery cell 21. In addition, the flexible printed circuit board 140 is connected to the module connector and the busbar 51 while forming a bent portion 143 bent toward the busbar frame 53 at the end of the upper frame 131.

In addition, a module case 35 is provided to accommodate the cell assembly 20 and the upper frame 131. The bus bar assembly 50 is coupled to one or both sides of the module case 35 positioned in the direction in which the electrode leads 23 of the cell assembly 20 are drawn out, and the end plate 60 is coupled to the outside thereof. And the flexible printed circuit board 140 is mounted on one surface of the upper frame 131 inside the module case 35.

Referring to FIGS. 3 and 4, a protective cover 170 may be mounted on the upper frame 131 to cover the flexible printed circuit board 140. The protective cover 170 may include a main cover portion 171 parallel to the main surface of the upper frame 131, and an edge portion 173 bent to surround the edge of the cell assembly 20. In addition, the protective cover 170 may include an eaves portion 175 which is bent and extended to correspond to the bent portion 143 of the flexible printed circuit board 140.

The protective cover 170 may cover and protect the flexible printed circuit board 140 mounted on the upper frame 131 when the cell assembly 20 and the upper frame 131 are accommodated in the module case 35. Thereby, the flexible printed circuit board 140 can be prevented from being exposed during the assembling process, thereby preventing damage.

Meanwhile, the eaves portion 175 and the edge portion 173 of the protective cover 170 may extend at mutually different angles with respect to the main surface of the main cover portion 171. That is, as shown in FIG. 4, the angle at which the eaves portion 175 is bent with respect to the main surface of the main cover portion 171 may be formed smaller than the angle at which the edge portion 173 is bent. The eaves portion 175 may be formed by cutting a part of the edge portion 173 of the protective cover 170. Meanwhile, referring to FIG. 5, the eaves portion 175 of the protective cover 170 may be positioned between the bent portion 143 of the flexible printed circuit board 140 and the end plate 60.

That is, the eaves portion 175 of the protective cover 170 may be positioned to correspond to a part of the flexible printed circuit board 140 which extends to be connected to the module connector or the busbar 51. Therefore, the eaves portion 175 of the protective cover 170 is lifted upward than the edge portion 173 so that the bent portion 143 of the flexible printed circuit board 140 is not bent steeply.

The protective cover 170 may be made of a non-conductive injected material so that it covers the flexible printed circuit board 140 but does not have electrical interference such as a short circuit even when in contact with it.

Meanwhile, referring back to FIGS. 3 and 4 again, the protective cover 170 may include a reinforcing portion 176 extending along the longitudinal direction of the cell assembly 20 and formed into a recessed shape outwardly. In this case, a plurality of the reinforcing portions 176 may be formed side by side, and the flexible printed circuit board 140 may be positioned between the reinforcing portions 176 adjacent to each other.

The reinforcing portion 176 can prevent the plate-like protective cover 170 from being easily distorted or deformed, and can improve strength. In addition, as the flexible printed circuit board 140 is positioned between adjacent reinforcing portions 176, the flexible printed circuit board 140 does not move on the upper frame 31 and its position can be fixed.

According to another embodiment of the present disclosure, the protective cover covering the flexible printed circuit board does not separately include the eaves portion and the edge portions having different bent angles, but may be formed to have the eaves portion bent at a single angle. Accordingly, when the design of the flexible printed circuit board varies according to the type of the battery module, there is an advantage that it can be applied in common regardless of the position of the bent portion of the flexible printed circuit board.

According to still another embodiment of the present disclosure, the reinforcing portion may be designed according to the design of the flexible printed circuit board and applied to the protective cover. In this case, it is possible to more precisely cover and protect the flexible printed circuit board.

Meanwhile, one or more of the battery modules according to an embodiment of the present disclosure may be packaged in the pack case to form a battery pack.

The above-mentioned battery module and the battery pack including the same can be applied to various devices. Such devices include, but not limited to, transportation means such as an electric bicycle, an electric vehicle, and a hybrid vehicle, and the present disclosure is applicable to various devices capable of using any battery module and any battery pack including the same, which also falls under the scope of the present disclosure.

Although the preferred embodiments of the present disclosure have been described in detail above, the scope of the present disclosure is not limited thereto, and various modifications and improvements of those skilled in the art using the basic concepts of the present disclosure defined in the following claims also belong to the scope of rights.

DESCRIPTION OF REFERENCE NUMERALS 10, 100: battery module
20: cell assembly
21: battery cell
23: electrode lead
31, 131: upper frame
35: module case
40, 140: flexible printed circuit board
43, 143: bent portion
50: busbar assembly
51: busbar
53: busbar frame
60: end plate
170: protective cover
171: main cover portion
173: edge portion
175: eaves portion
176: reinforcing portion

The invention claimed is:

1. A battery module including:
a cell assembly including at least one battery cell;
a module case accommodating the cell assembly;

an upper frame positioned on one surface of the cell assembly in the module case to at least partially cover the cell assembly;
a flexible printed circuit board configured to be mounted longitudinally on the upper frame to sense the battery cell; and
a protective cover, the protective cover having a main cover portion parallel to a main surface of the upper frame and mounted on the upper frame to cover the flexible printed circuit board in the module case, the main cover portion having a pair of side edges and a straight end edge extending between the pair of side edges,
wherein the flexible printed circuit board includes a bent portion which is bent toward one side of the cell assembly at an end of the upper frame, and
wherein the protective cover further includes an eaves portion which extends outwardly from the straight end edge of the main cover portion and bent downwardly at the straight end edge of the main cover portion to correspond to the bent portion of the flexible printed circuit board.

2. The battery module of claim 1, wherein the protective cover further includes an edge portion bent to surround the edge of the cell assembly, and
wherein the eaves portion and the edge portion extend at different angles with respect to the main surface of the main cover portion.

3. The battery module of claim 2, wherein angle at which the eaves portion is bent with respect to the main surface of the main cover portion is smaller than an angle at which the edge portion is bent with respect to the main cover portion.

4. The battery module of claim 2, wherein the eaves portion is formed by cutting a part of the edge portion.

5. The battery module of claim 1, further comprising:
a bulbar assembly comprising a bulbar electrically connected to an electrode lead of the cell assembly, and a bulbar frame covering the cell assembly on at least one side; and
an end plate covering the bulbar assembly on the outside,
wherein the eaves portion of the protective cover is positioned between the bent portion of the flexible printed circuit board and the end plate.

6. The battery module of claim 1, wherein the protective cover is made of a non-conductive injected material.

7. The battery module of claim 1, wherein the protective cover further includes a reinforcing portion extending along the longitudinal direction of the cell assembly and formed into a recessed shape when viewed from the outside.

8. The battery module of claim 7, wherein a plurality of the reinforcing portions is formed, and the flexible printed circuit board is positioned between adjacent reinforcing portions.

9. A battery pack including:
at least one battery modules according to claim 1, and
a pack case packaging the at least one battery module.

10. A device including at least one of the battery pack according to a 9.

* * * * *